(12) United States Patent
Gogoi

(10) Patent No.: US 8,049,261 B2
(45) Date of Patent: Nov. 1, 2011

(54) SEMICONDUCTOR STRUCTURE AND METHOD OF MANUFACTURE

(75) Inventor: Bishnu Prasanna Gogoi, Scottsdale, AZ (US)

(73) Assignee: HVVi Semiconductors, Inc., Phoenix, AZ (US)

( * ) Notice: Subject to any disclaimer, the term of this patent is extended or adjusted under 35 U.S.C. 154(b) by 450 days.

(21) Appl. No.: 12/244,485

(22) Filed: Oct. 2, 2008

(65) Prior Publication Data

US 2009/0108403 A1 Apr. 30, 2009

Related U.S. Application Data

(60) Provisional application No. 60/983,052, filed on Oct. 26, 2007.

(51) Int. Cl.
*H01L 27/108* (2006.01)

(52) U.S. Cl. ........................ 257/301; 438/667

(58) Field of Classification Search .................. 257/301, 257/E21.597; 438/667
See application file for complete search history.

(56) References Cited

U.S. PATENT DOCUMENTS

| | | | |
|---|---|---|---|
| 5,258,321 A | 11/1993 | Shimizu et al. | |
| 6,613,690 B1 | 9/2003 | Chang et al. | |
| 2008/0048232 A1* | 2/2008 | Su et al. | 257/301 |
| 2008/0280435 A1* | 11/2008 | Klootwijk et al. | 438/667 |

FOREIGN PATENT DOCUMENTS

| | | |
|---|---|---|
| JP | 60261168 | 12/1985 |
| WO | 2009/055140 A1 | 4/2009 |

OTHER PUBLICATIONS

PCT/US2008/074480, "International Search Report/Written Opinion received for PCT Application No. PCT/US2008/074480 mailed on Mar. 24, 2009", 11 Pages.

International Report on Patentability/ Written Opinion received for PCT Application No. PCT/US2008/074480, mailed May 6, 2010, 6 pages.

* cited by examiner

*Primary Examiner* — Michael Shingleton
(74) *Attorney, Agent, or Firm* — Cool Patent, P.C.; Kenneth J. Cool

(57) ABSTRACT

In various embodiments, semiconductor structures and methods to manufacture these structures are disclosed. In one embodiment, a capacitor embedded in a dielectric material below the surface of a semiconductor substrate is disclosed. Other embodiments are described and claimed.

16 Claims, 9 Drawing Sheets

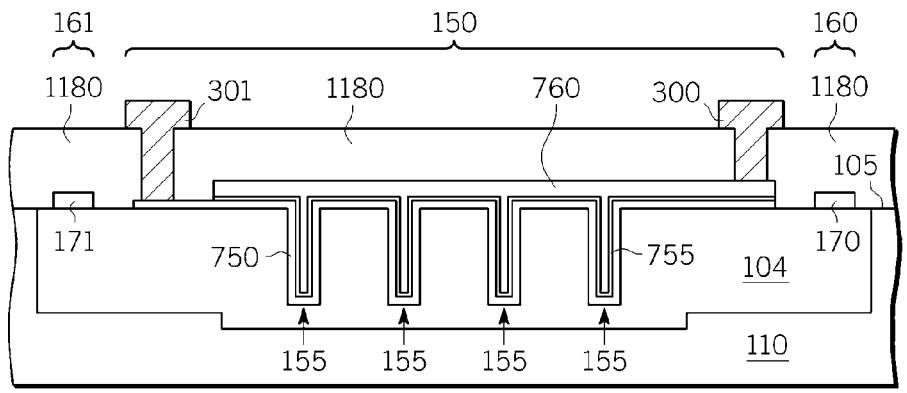
*FIG. 1*
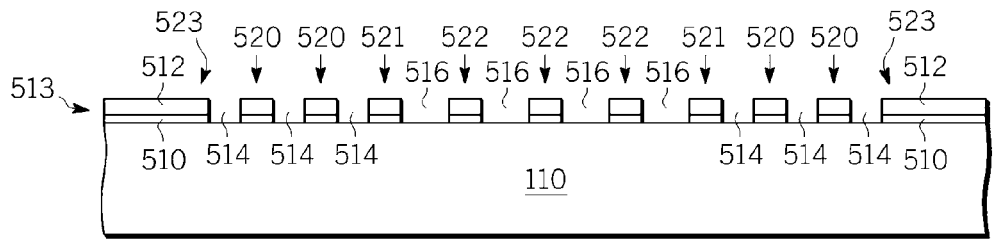
*FIG. 2*
*FIG. 3*
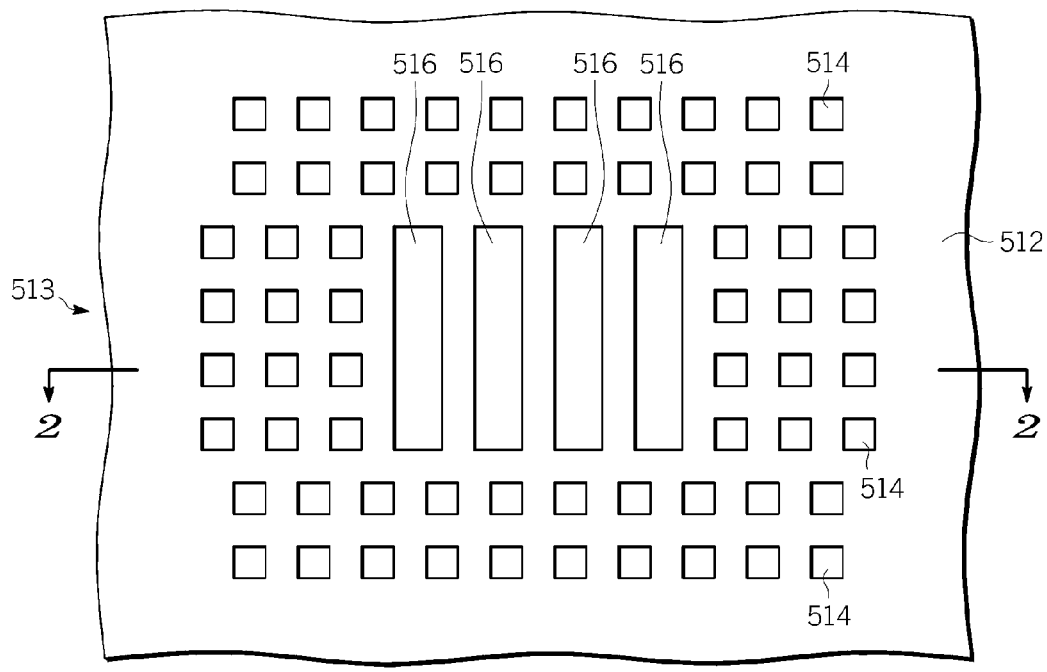

SEMICONDUCTOR STRUCTURE AND METHOD OF MANUFACTURE

CROSS-REFERENCE TO RELATED APPLICATIONS

The present application claims the benefit of U.S. Provisional Application No. 60/983,052 filed Oct. 26, 2007. Said Application No. 60/983,052 is hereby incorporated by reference in its entirety.

TECHNICAL FIELD

Embodiments disclosed herein relate generally to electrical and semiconductor technology, and more specifically to a semiconductor structure that includes a dielectric structure and a capacitor.

BACKGROUND

For some applications, such as digital, analog, RF or mixed signal circuits, passive components such as capacitors may be integrated with active devices on a single semiconductor die. Integration of such passive components leads to reduced fabrication costs, smaller physical size and increased reliability. In the case of capacitors, applications may include bypass capacitors to minimize power supply noise or other disturbances on a power supply, circuit capacitors for example in filter applications and charge storage capacitors for memory chips or imaging chips.

To date semiconductor manufacturers have had difficulty integrating capacitors on a semiconductor die, particularly with large capacitance values and/or for operation at high frequency. Large capacitance values require large areas, which consume space on the semiconductor die leading to greatly increased cost. To reduce die area consumed by large value capacitors, semiconductor manufacturers have developed trench capacitors in which the vertical dimension is utilized to increase capacitor area while minimizing surface area on the die.

Current trench capacitors utilize trenches etched into the conductive semiconductor substrate in which capacitors are formed. The conductive substrate results in parasitic coupling between the capacitor and the conductive substrate or other conductive elements, leading to a reduction in the frequency of operation of the circuit.

Further, capacitors and other passive components may be physically and electrically isolated from each other and from other conductive components including conductive components of active devices. When such conductive components come within close proximity to each other or other conductive components, interaction may occur between them resulting in reduced frequency of operation and/or compromised circuit performance, for example by cross-talk, where a signal from one conductive component is coupled into the signal from another conductive component.

BRIEF DESCRIPTION OF THE DRAWINGS

FIG. 1 is a cross-sectional view of a semiconductor structure in accordance with an embodiment;

FIG. 2 is a cross-sectional view of the semiconductor structure of FIG. 3 taken along section line 2-2;

FIG. 3 is a plan view of the semiconductor structure of FIG. 1 at an early stage of manufacture;

Figure 4:
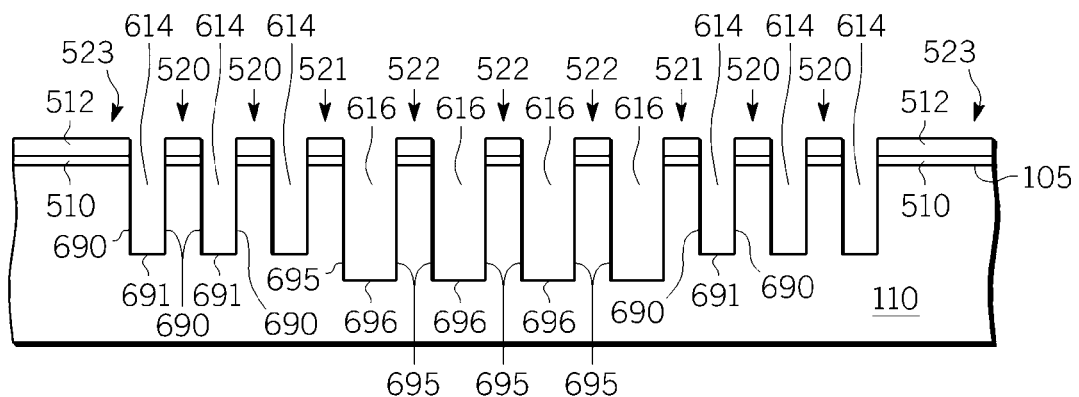
FIG. 4 is a cross-sectional view of the semiconductor structure of FIG. 2 at a later stage of manufacture.

For simplicity of illustration and ease of understanding, elements in the various figures are not necessarily drawn to scale, unless explicitly so stated. Further, if considered appropriate, reference numerals have been repeated among the figures to indicate corresponding and/or analogous elements. In some instances, well-known methods, procedures, components and circuits have not been described in detail so as not to obscure the present disclosure. The following detailed description is merely exemplary in nature and is not intended to limit the disclosure of this document and uses of the disclosed embodiments. Furthermore, there is no intention that the appended claims be limited by the title, technical field, background, or abstract.

DETAILED DESCRIPTION

In the following description and claims, the terms "comprise" and "include," along with their derivatives, may be used and are intended as synonyms for each other. In addition, in the following description and claims, the terms "coupled" and "connected," along with their derivatives, may be used. "Connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. For example, "coupled" may mean that two or more elements do not contact each other but are indirectly joined together via another element or intermediate elements. Finally, the terms "on," "overlying," and "over" may be used in the following description and claims. "On," "overlying,"

and "over" may be used to indicate that two or more elements are in direct physical contact with each other. However, "over" may also mean that two or more elements are not in direct contact with each other. For example, "over" may mean that one element is above another element but not contact each other and may have another element or elements in between the two elements.

FIG. 1 shows a cross-sectional view of a semiconductor structure 100 comprising a substrate 110, a dielectric material 1180, and a dielectric structure 104. Dielectric structure 104 may be referred to as a dielectric platform, dielectric material or a dielectric region. Dielectric structure 104 may be formed at least partially below surface 105 of substrate 110 and thus may also be referred to as an embedded dielectric platform. Dielectric structure 104 may be comprised of one or more relatively low dielectric constant materials, for example, silicon dioxide. In addition, in some embodiments, dielectric structure 104 may include one or more voids or air gaps. Since empty space has the lowest dielectric constant (the dielectric constant of empty space is 1), the more empty space or void space incorporated into dielectric structure 104, the lower the overall or effective dielectric constant of dielectric structure 104.

In some embodiments, substrate 110 may be referred to as a device layer or an active layer. Further, in some embodiments, substrate 110 may include one or more epitaxial layers or bonded layers. Substrate 110 may comprise a semiconductor material such as, for example, silicon, and may be doped or undoped depending on the application.

Semiconductor structure 100 may comprise passive element regions 160 and 161 and a trench capacitor 150. As shown in FIG. 1 passive elements 170 and 171 may be formed over a portion of dielectric structure 104, for example in regions 160 and 161 adjacent to trench capacitor 150, using conventional semiconductor processing. Examples of passive devices may include capacitors, inductors, and resistors or interconnects.

Although not shown in FIG. 1, active regions comprising a portion of substrate 110 may be formed outside of dielectric structure 104 where active devices, such as, for example, transistors or diodes, or portions of active devices, may be formed. Active devices may be formed in active regions using conventional MOS (metal oxide semiconductor), complementary metal oxide semiconductor (CMOS), bipolar, or bipolar-CMOS (BiCMOS) processes. The active regions may also be referred to as circuit sections, subsections, sub-circuits, active areas or active area regions or portions of active areas. Active devices may be formed in active regions before or after fabrication of trench capacitor 150.

Trench capacitor 150 may comprise a portion of dielectric structure 104, a bottom electrode contact 301, a top electrode contact 300, a portion of dielectric material 1180, conductive layers 750 and 760 and a dielectric layer 755. Trench capacitor 150 may be a parallel plate capacitor in which two conductive electrodes are separated by a dielectric material. In this example the two electrodes are conductive layers 750 and 760 and the dielectric is dielectric layer 755. In other embodiments, trench capacitor 150 may include more than two conductive layers, for example, a higher density capacitor, such as a three plate capacitor, can be formed by forming more than two conductive layers. In the example shown in FIG. 1, trench capacitor 150 is comprised of four (4) fingers 155 although this is not a limitation of the claimed subject matter. In other embodiments, any number of fingers 155 may be employed. Trench capacitor 150 may also be referred to as a capacitor, an embedded capacitor, an embedded trench capacitor, a passive device, passive element, an integrated passive element, or an integrated passive device.

Top electrode contact 300 permits coupling of the top electrode of trench capacitor 150 to an external circuit. In this example top electrode of trench capacitor 150 may comprise conductive layer 760. Bottom electrode contact 301 permits coupling of the bottom electrode of trench capacitor 150 to an external circuit. In this example bottom electrode of trench capacitor 150 may comprise conductive layer 750.

As will be discussed further below, at least a portion of dielectric structure 104 may be between conductive layer 750 and substrate 110. The portion or portions of dielectric structure 104 between conductive layer 750 and substrate 110 may be relatively thick to reduce parasitic capacitance between conductive layer 750 and substrate 110. For example, the portion of dielectric material 104 between conductive layer 750 and substrate 110 may have a thickness of at least about one micron or greater, although the methods and apparatuses described herein are not limited in this regard. At least a portion of dielectric structure 104 may surround all of or a portion of each finger 155 of trench capacitor 150.

Trench capacitor 150 may be integrated with other passive and/or passive circuit elements. Semiconductor structure 100 provides for large value capacitors with reduced parasitic capacitances, relatively higher frequencies of operation, improved isolation, reduced cross-talk, where a signal from one conductive element is coupled into the signal from another conductive element, or combinations thereof between capacitors and other active and/or passive circuit elements.

The capacitance of a parallel plate capacitor is given by the equation $C=\in A/d$ where $\in$ is the dielectric constant of the capacitor dielectric, A is the area of the capacitor and d is the thickness of the capacitor dielectric. Higher capacitances may be achieved by increasing the dielectric constant of the capacitor dielectric, decreasing the thickness of the capacitor dielectric and/or increasing the area of the capacitor.

Increasing the dielectric constant of the capacitor dielectric and decreasing the thickness of the capacitor dielectric are technology issues which may be addressed during scaling of circuits to smaller dimensions. Any advances in these areas may be directly applied to the semiconductor structure 100.

In parallel plate capacitors that are formed with plates above the top surface of a substrate and are formed parallel to, or substantially parallel to the top surface of the substrate, increasing the area of the parallel plate capacitor may result in an unacceptably large increase in die size and thus increased cost. To reduce die area consumed by large value capacitors, a trench capacitor may be used in which the vertical dimension is utilized to increase capacitor area while minimizing surface area on the die. However, some trench capacitors are formed in, or substantially in the conductive semiconductor substrate. For example, some trench capacitors may be formed such that portions of the conductive electrodes of the trench capacitor that are below the substrate surface may have portions of conductive substrate or semiconductor material between the subsurface conductor electrodes. The presence of the conductive substrate, and potentially other conductive circuit elements, in close proximity to the capacitor results in undesired parasitic coupling between the trench capacitor and the conductive substrate or other conductive elements, leading to increased parasitic capacitive coupling, a reduction in the frequency of operation of the circuit and increased cross-talk, where a signal from one interconnect is coupled into the signal from another interconnect.

Further, it may be desirable to physically and electrically isolate capacitors and other passive elements from each other and from other conductive elements. When such conductive elements come within close proximity to each other or other conductive elements, interaction may occur between them resulting in reduced frequency of operation and/or compromised circuit performance, for example by cross-talk.

Referring to FIG. 1, semiconductor structure 100 utilizes the vertical dimension below surface 105 of substrate 110 to form capacitors having a larger area than a capacitor formed on or over the surface using the same amount of surface area on surface 105 of substrate 110 as used by the trench capacitor. This vertical structure can be used to provide an increased capacitance in a given surface area.

Trench capacitor 150 can be formed having a relatively large separation between trench capacitor 150 and any surrounding conductive circuit elements. For example, trench capacitor 150 may be separated from any surrounding conductive elements by a distance of at about one micron or greater, although the methods and apparatuses described herein are not limited in this regard. Furthermore, each capacitor finger 155 may be surrounded, or substantially surrounded by insulating dielectric structure 104, instead of conductive substrate 110 as may be done in other implementations. Dielectric structure 104 may physically and electrically isolate trench capacitor 150 from other passive components and from other conductive components or elements. The increased separation distance, and the use of dielectric structure 104 between fingers 155 can provide a reduction in interaction between trench capacitor 150 and other components resulting in reduced parasitic capacitive coupling, increased frequency of operation and reduced cross-talk.

In some embodiments, the separation between conductive layer 750, which forms the bottom electrode of trench capacitor 150, and conductive substrate 110 may be in the range of about 1 micron to about 5 microns (μm). In other words, the thickness of In some trench capacitors the trench may be lined with a relatively thin dielectric prior to deposition of conductive material 750. Such a relatively thin dielectric may have a thickness in the range of about 0.1 μm to about 0.5 μm.

Again, referring to FIG. 1, passive elements 170 and 171 may be formed in passive element regions 160 and 161 over a portion of dielectric structure 104. The portion of dielectric structure 104 under passive elements 170 and 171 may have a thickness in the range of about 3 μm to about 40 μm. The width of the portion of dielectric structure 104 adjacent to passive elements 170 and 171 may have a width in the range of about 2.0 μm to about 500 μm. This increased spacing and the low dielectric constant or permittivity of dielectric structure 104 compared to conductive substrate 110, greatly reduces the parasitic capacitive coupling to other conductive elements, resulting in higher frequency operation, improved isolation and reduced cross-talk.

As an example, the passive element region may comprise one or more electrically conductive materials forming passive components, for example, aluminum, copper, or doped polycrystalline silicon formed over dielectric structure 104. In various examples, passive components may be an inductor, a capacitor, a resistor, or an electrical interconnect and may be coupled to one or more active devices (not shown in FIG. 1).

Further, dielectric structure 104 may be used to form relatively high quality passive devices such as, for example, capacitors and inductors having a relatively high quality factor (Q) since dielectric structure 104 may be used to isolate and separate the passive devices from the substrate. Active devices, such as transistors or diodes, may be formed in regions adjacent to, or abutting, dielectric structure 104, and these active devices may be coupled to and employ passive components such as spiral inductors, interconnects, microstrip transmission lines and the like that are formed on a planar upper surface of dielectric structure 104. Separating the passive components from substrate 110 allows higher Q's to be realized for these passive components.

The structure described in FIG. 1 may be fabricated before or after fabrication of any optional active devices. In other words, some embodiments are capable of withstanding relatively high temperature operations required in active device fabrication.

As stated above, dielectric material 104 may be comprised of one or more low dielectric constant materials, for example silicon dioxide or air. Silicon dioxide ($SiO_2$) has a dielectric constant of about 3.9. Accordingly, a solid or filled dielectric structure that includes no voids, such as dielectric material 104, and includes silicon dioxide may have a dielectric constant of about 3.9. In other embodiments described herein, dielectric structure 104 may include voids occupying a portion of the total volume of dielectric material 104. This may result in an effective dielectric constant reduction in proportion to the void space to dielectric material.

FIG. 1 shows an example in which one trench capacitor 150 is formed in one dielectric structure 104. However this is not a limitation of the claimed subject matter and in other embodiments a plurality of trench capacitors may be formed in one dielectric structure. Furthermore, other embodiments may include a plurality of dielectric structures such as dielectric structure 104, each with one or more trench capacitors.

FIG. 1 shows an example in which one passive element 171 is formed in passive element region 161 and one passive element 170 is formed in passive element region 160. However this is not a limitation of the claimed subject matter and in other embodiments any number of passive elements may be formed in any number of passive element regions over dielectric structure 104.

Substrate 110 may serve as part of a drain region of a vertical transistor (not shown) formed outside of dielectric structure 104. In this example, a source contact or electrode (not shown) may be formed on or adjacent to an upper surface of substrate 110 and a drain electrode (not shown) may be formed on or adjacent to a lower surface of substrate 110. During operation, the electrical current flow from the source electrode to the drain electrode in the vertical transistor may be substantially perpendicular to the upper and lower surfaces of semiconductor substrate 110. In other words, current flows essentially vertically through the vertical transistor from the electrode located adjacent a top surface of semiconductor structure 100 to a drain electrode located adjacent to the opposite bottom surface of semiconductor structure 100. An example of a vertical transistor is described in U.S. patent application Ser. No. 10/557,135, entitled "POWER SEMICONDUCTOR DEVICE AND METHOD THEREFOR," filed Nov. 17, 2005, which claims priority to Patent Cooperation Treaty (PCT) International Application Number PCT/US2005/000205 entitled "POWER SEMICONDUCTOR DEVICE AND METHOD THEREFOR," having an International Filing Date of Jan. 6, 2005 and an International Publication Date of Jul. 28, 2005, the contents of both of these patent applications are incorporated herein by reference in their entirety.

FIGS. 2 to 11 illustrate at least one embodiment for making semiconductor structure 100 of FIG. 1. Turning to FIGS. 2 and 3, FIG. 3 is a plan view of semiconductor structure 100 of FIG. 1 at an early stage of manufacture and FIG. 2 is a cross-sectional view of semiconductor structure 100 of FIG. 3 taken along section line 2-2 of FIG. 3.

At the stage illustrated in FIG. 2, dielectric layer 510 is formed over substrate 110 and dielectric layer 512 is formed over dielectric layer 510. In one example dielectric layer 510 may be silicon dioxide and dielectric layer 512 may be silicon nitride. Dielectric layer 510 may comprise, for example, silicon dioxide and have a thickness ranging from about 50 Angstroms (Å) to about 5,000 Å. Dielectric layer 510 may be formed using deposition techniques or thermal growth techniques such as, for example, thermal oxidation of silicon. Dielectric layer 512 may comprise, for example, silicon nitride ($Si_3N_4$) and have a thickness ranging from about 100 Å to about 15,000 Å. Dielectric layer 512 may be formed using deposition techniques, for example, low pressure chemical vapor deposition (LPVCD) of silicon nitride.

In an alternate embodiment, only dielectric material 510 may be formed (not shown). Dielectric layer 510 may comprise, for example, silicon dioxide and have a thickness ranging from about 1000 Å to about 20,000 Å.

After dielectric layer 512 is formed, dielectric layer 512 and dielectric layer 510 may be patterned using photolithography and etching processes to form openings 514 and 516 and masked or covered areas 520, 521, 522 and 523. Masked areas 520, 521, 522, and 523 include portions of layers 510 and 512. Masked area 520 is between two openings 514, masked area 521 is between one opening 514 and one opening 516, masked area 522 is between two openings 516 and masked area 523 defines the periphery of what will become dielectric structure 104 (FIG. 1). Masked areas 520, 521, 522, and 523 together form a mask structure 513 and openings 514 and 516 expose portions of substrate 110. Photolithography processes or operations involve the use of masks and may sometimes be referred to as masking operations or acts. The photolithography and etching may include forming a layer of a radiation-sensitive material, such as, for example, photoresist (not shown), over dielectric layer 512, then exposing the photoresist using, for example, ultraviolet (UV) radiation and developing the resist to form a mask, and then etching portions of dielectric layers 512 and 510 to form openings 514 and 516.

Openings 514 and 516 may be formed using at least one etching operation. In some embodiments, two etching operations may be used to form openings 514 and 516. In some embodiments, silicon nitride layer 512 may be etched using a wet chemical etch or a dry etch process such as, for example, a reactive ion etch (RIE). In some embodiments, silicon dioxide layer 510 may be etched using a wet chemical etch or a dry etch process such as, for example, a reactive ion etch (RIE).

Figure 7:
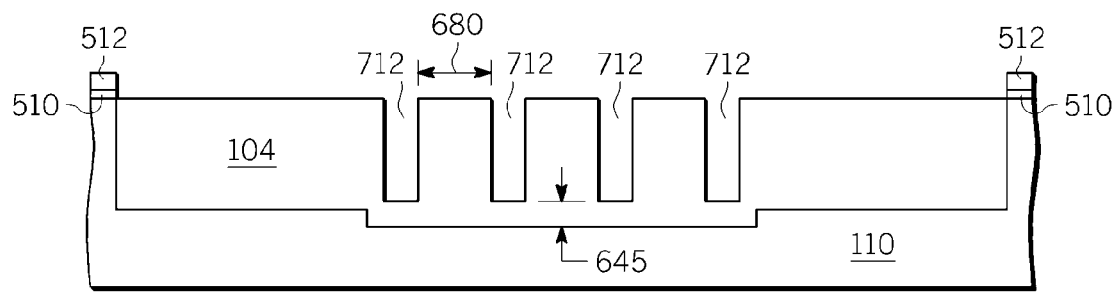
FIG. 7 is a cross-sectional view of the semiconductor structure of FIG. 6 taken along section line 7-7.

The width of openings 516 determine the width of the subsequently formed cavity 712 (FIG. 7) and the width of masked areas 521 and 522 determine the spacing 680 (FIG. 7) between cavities 712 (FIG. 7). In one example, openings 514 and masked areas 520, 521 and 522 each have a width equal to, or substantially equal to that of the desired width of subsequently formed cavity 712 (FIG. 7) and the width of openings 516 have a width equal to about twice the desired width of subsequently formed trench 712 (FIG. 7). In this example the spacing between trenches 680 may be equal to about twice the desired width of subsequently formed trench 712 (FIG. 7).

The width of openings 514 and masked areas 520 may be adjusted such that after oxidation the silicon under masked areas 520 is completely converted to silicon. Because silicon undergoes a 2.2× volume expansion when oxidized, this condition may be achieved by having openings 514 and masked areas 520 have substantially the same width. However this is not a limitation of the claimed subject matter and in other embodiments these dimensions may be adjusted such that a portion of the silicon under masked areas 520 may remain after oxidation.

In one example the width or diameter of openings 514 and masked areas 520, 521 and 522 may each be in the range of about 0.25 microns to about 3 microns and the width or diameter of openings 516 may be in the range of about 1.5 µm to about 5 µm.

Although the spacing between any two openings (either 514 and/or 516) shown in FIG. 2 may be substantially the same, this is not a limitation of the claimed subject matter. The spacing between openings 514 and the size of openings 514 do not have to be the same, or substantially the same. Although masked areas 520, 521 and 522 in FIG. 2 may all have substantially the same width, this is not a limitation of the claimed subject matter and in other embodiments, masked areas 520, 521 and 522 may all have different widths.

The width of mask area 523 may determine the extent of dielectric structure 104 and may be dependent on the circuit layout. In one example the width of masked area 523 may be in the range of about 3 µm to about 1000 µm. In another example the width of masked area 523 may be in the range of about 5 µm to about 50 µm.

Dielectric layer 512 or a combination of dielectric layer 510 and dielectric layer 512 may serve as a hard mask, and may be referred to as a masking layer. Since the photoresist (not shown) over dielectric 512 may optionally be left in place during the next etch step, it may also be etched as part of the etch step used to etch portions of dielectric layer 512, portions of dielectric layer 510 and portions of substrate 110. Dielectric layer 512 or a combination of dielectric layer 510 and dielectric layer 512 may be used as a hard mask to prevent the undesired etching of the upper surface of substrate 110 during the formation of openings 514 and 516 and subsequent removal of a portion of substrate 110 exposed by openings 514 and 516. In alternate embodiments, the photoresist layer may be made relatively thick such that it is not completely eroded during the etching process. Accordingly the thickness of dielectric material 510 or the combination of dielectric materials 510 and 512 must be large enough so that it is not completely removed during the next etching step.

Referring now to FIG. 3, in FIG. 3 opening 514 is shown with a square shape while opening 516 is shown with a rectangular shape. In some examples opening 516 may have a rectangular shape with the ratio of the longer side to the shorter side in the range of about 5 to 2000. In one example the short side of opening 516 may be in the range of about 0.5 µm to about 5 µm. In one example the long side of opening 516 may be in the range of about 20 µm to about 1500 µm. While openings 516 are shown as all having the same dimensions in the example in FIG. 3, this is not a limitation of the claimed subject matter and openings 516 may have different widths and lengths. Furthermore, although openings 516 are shown as rectangular, this is not a limitation of the claimed subject matter and openings 516 may have any shape and may be formed in a periodic or non-periodic arrangement.

Referring still to FIG. 3, in FIG. 3 opening 514 is shown with a square shape. In one example the side dimension of opening 514 may be in the range of about 0.3 µm to about 4 µm. While opening 514 are shown as all having the same dimensions in the example in FIG. 3, this is not a limitation of the claimed subject matter and openings 514 may have different sizes. Furthermore, although openings 514 are shown as square, this is not a limitation of the claimed subject matter and openings 514 may have any shape and may be formed in a periodic or non-periodic arrangement.

Figure 5:
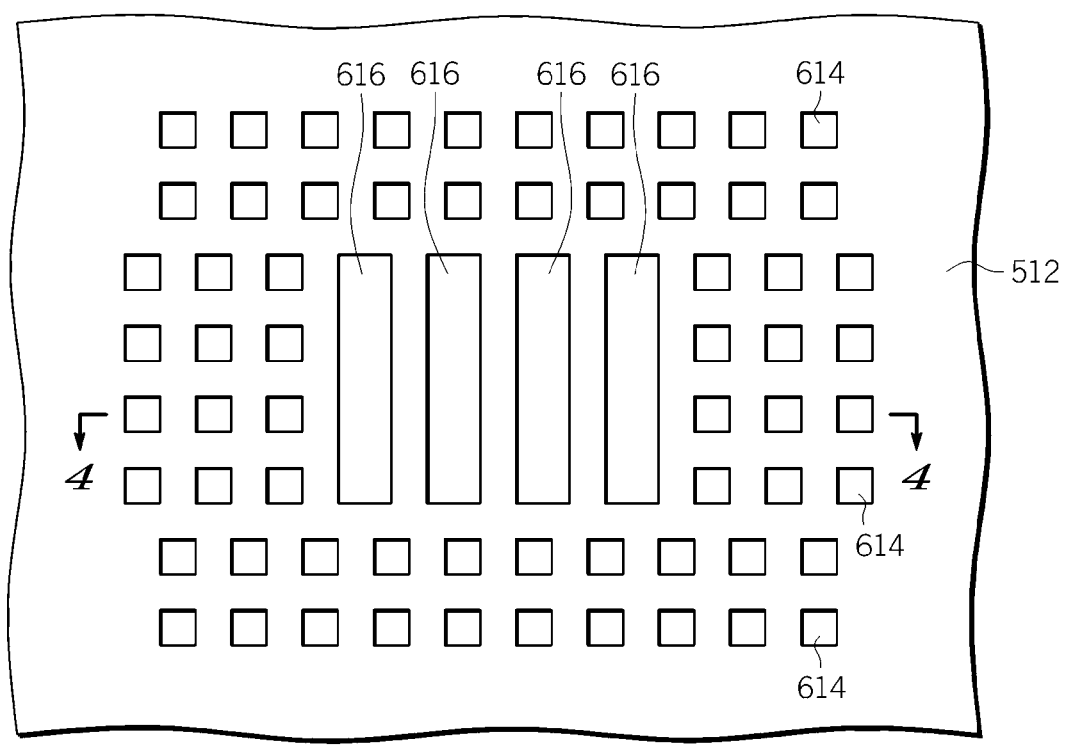
FIG. 5 is a plan view of the semiconductor structure of FIG. 2 at a later stage of manufacture.

Turning to FIGS. 4 and 5, FIGS. 4 and 5 are cross-sectional and plan views, respectively, of semiconductor structure 100 of FIG. 2 at a later stage of manufacture. Further, FIG. 4 is a cross-sectional view of semiconductor structure 100 of FIG. 6 taken along section line 4-4 of FIG. 6.

After forming openings 514 (FIGS. 2 and 3) and 516 (FIGS. 2 and 3) cavities 614 and 616 are formed in substrate 110 using mask 523 (FIGS. 2 and 3) and a wet chemical or dry etch, for example reactive ion etching (RIE) to remove portions of substrate 110. Cavities 614 and 616 may be referred to as voids, open voids, cavities, open cavities, pores, openings or trenches. In one embodiment, one etching step may be used to form cavities 614 and 616, although the methods and apparatuses described herein are not limited in this regard. In one embodiment, cavities 614 and 616 may have an aspect ratio (the ratio of the depth to width) of at least two (2). In another example, the aspect ratio may be at least ten (10). For a given cavity width, a larger aspect ratio may result in a larger capacitance value for the trench capacitor.

In one example the depth of cavities 614 and 616 may be in the range of about 3 μm to about 40 μm. In another example the depth of cavities 614 and 616 may be in the range of about 6 μm to about 25 μm.

Cavities 614 have sidewalls 690 and bottom 691 and cavities 616 have sidewalls 695 and bottom 696. While sidewalls 690 and 695 are shown as perpendicular to, or substantially perpendicular to surface 105 of substrate 110, other sidewall profiles may also be utilized and the specific sidewall profile is not a limitation of the claimed subject matter. Similarly, while bottoms 691 and 696 are shown as parallel to, or substantially parallel to surface 105 of substrate 110, other bottom profiles may also be utilized and the specific bottom profile is not a limitation of the claimed subject matter.

In FIG. 4 the depth of cavity 616 is shown as deeper than that of the depth of cavity 614. In some examples when cavities 614 and 616 are formed simultaneously, cavity 616 may be deeper than cavity 614 as a result of a higher etch rate for wider openings. In other examples cavities 614 and 616 may have the same depth or may be formed separately and in that case the depth of cavities 614 and 616 may be determined individually. The relative depth of cavities 614 and 616 is not a limitation of the claimed subject matter, and the depth of cavity 616 may be shallower, substantially equal to or deeper than the depth of cavity 614.

Figure 6:
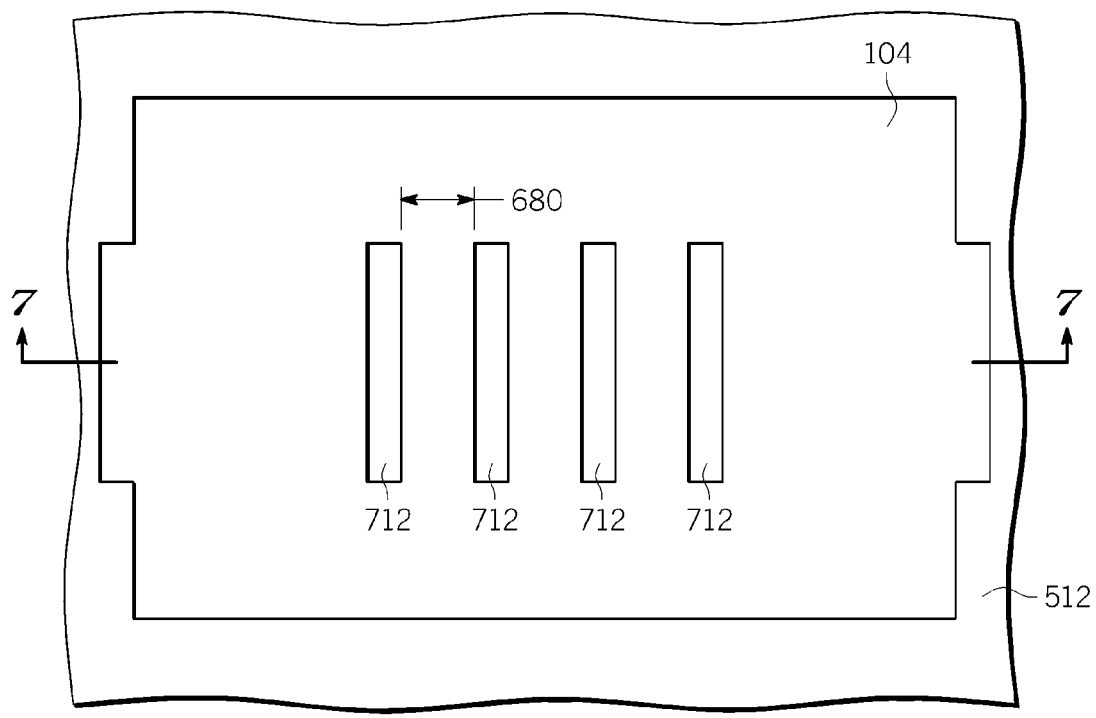
FIG. 6 is a plan view of the semiconductor structure of FIG. 4 at a later stage of manufacture.

FIG. 6 shows a plan view of semiconductor structure 100 of FIG. 4 at a later stage of manufacture. FIG. 7 shows a cross-sectional view of semiconductor structure 100 of FIG. 6 taken along section line 7-7 of FIG. 6. Turning first to FIG. 7, after forming cavities 614 and 616 (FIGS. 4 and 5), a dielectric material 104 is formed on the exposed surfaces of cavities 614 and 616 (FIGS. 4 and 5) resulting in the conversion of all of, or substantially all of the portions of semiconductor substrate) 10 under masked areas 520, 521 and 522 to dielectric material 104 and the formation of cavities 712. In one example, the dielectric material 104 is silicon dioxide and is formed by thermal oxidation of the exposed portions of semiconductor material 110. In this example thermal oxidation is performed to convert a portion of, all of, or substantially all of, the exposed silicon surrounding cavities 614 and 616 (FIGS. 4 and 5) to silicon dioxide to form silicon dioxide material 104.

In this example the silicon underneath masked areas 520 (FIG. 2), 521 (FIG. 2) and 522 (FIG. 2) is completely oxidized and the dimensions of masked areas 520 (FIG. 2), 521 (FIG. 2) and 522 (FIG. 2) and openings 514 (FIG. 2) are substantially equal such that cavities 614 (FIGS. 4 and 5) are eliminated through the oxidation process, leaving only oxide 104 and cavities 712. Cavities 614 are eliminated because of the 2.2× volume expansion that silicon undergoes when it is oxidized. This volume expansion also results in a reduction in the width of cavity 712 compared to the width of cavity 616 (FIGS. 4 and 5) before oxidation. In this embodiment, dielectric material 104 forms the dielectric structure 104 discussed above with reference to FIG. 1 and accordingly dielectric material 104 may be referred to as dielectric structure 104 in subsequent figures. As discussed above, in other embodiments, dielectric structure 104 may include voids and/or more than one dielectric material.

Although the widths of cavities 712 in FIG. 7 are all the same, this is not a limitation of the claimed subject matter. In other embodiments, cavities 712 may have different widths. The result of this oxidation process is the formation of cavities 712 in dielectric material 104.

In one example the depth of cavities 712 may be in the range of about 2 μm to about 40 μm. In another example the depth of cavities 712 may be in the range of about 4 μm to about 20 μm. In one example spacing between cavities 712 may be in the range of about 0.2 μm to about 2 μm.

Although cavities 712 are shown as rectangular, this is not a limitation of the claimed subject matter and cavities 712 may have any shape and may be formed in a periodic or non-periodic arrangement. In the example silicon 110 underneath masked areas 520, 521 and 522 (FIG. 4) is completely oxidized, leaving only oxide and no silicon. In other embodiments, silicon 110 underneath masked areas 520, 521 and 522 (FIG. 4) may only be partially oxidized, leaving some silicon material embedded in oxide 104.

The spacing between the bottom of cavity 712 and the bottom surface of dielectric material 104 is referenced as 645 in FIG. 7. In one example in which the silicon under masked areas 520, 521 and 522 is all converted to oxide, spacing 645 may be about equal to the width of the largest masked area among masked areas 520, 521 and 522. In another example spacing 645 may be determined by the duration of the oxidation step. In one example, the oxide thickness, and thus spacing 645 may be in the range of about 0.7 μm to about 4 μm. However, these constraints on spacing 645 are not a limitation of the claimed subject matter and in other embodiments, spacing 645 may be determined independently.

Since the dielectric constant of silicon is greater than the dielectric constant of silicon dioxide, reducing the amount of silicon remaining underneath masked areas 520, 521 and 522 (FIG. 4) may reduce the effective dielectric constant of dielectric structure 104.

Referring now to FIG. 6, in FIG. 6 cavity 712 is shown with a rectangular shape. In some examples cavity 712 may have a rectangular shape with the ratio of the longer side to the shorter side in the range of about 5 to about 2000. In one example the short side of cavity 712 may be in the range of about 0.2 μm to about 3 μm. In one example the long side of cavity 712 may be in the range of about 20 μm to about 1500 μm. While cavities 712 are shown as all having the same dimensions in the example in FIG. 6, this is not a limitation of the claimed subject matter and cavities 712 may have different widths and lengths. Furthermore, although cavities 712 are shown as rectangular, this is not a limitation of the claimed subject matter and cavities 712 may have any shape and may be formed in a periodic or non-periodic arrangement.

Again referring to the example in FIG. 6, cavities 614 (FIGS. 4 and 5) have been eliminated by the oxidation step. In other words in this example, the 2.2× expansion which occurs when silicon is oxidized causes sidewalls 690 (FIG. 4) of cavities 614 (FIG. 4) to merge together at the end of the oxidation process. Because cavities 616 (FIG. 4) are wider than cavities 614 (FIG. 4) in this example, sidewalls 695 (FIG. 4) of cavities 616 (FIG. 4) move towards each other, but do not merge, resulting in the formation of cavities 712.

Figure 8:
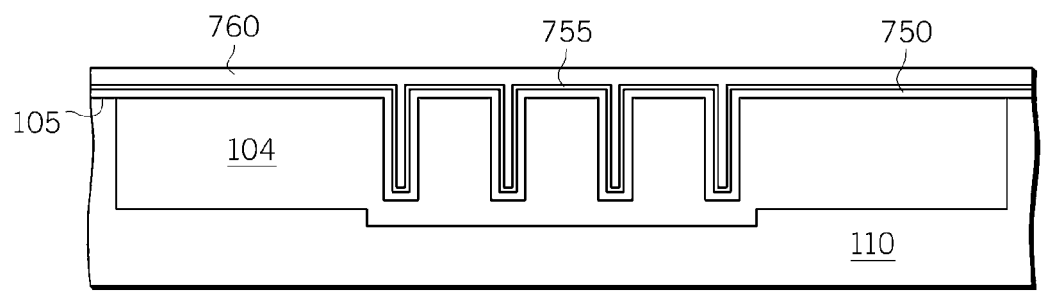
FIG. 8 is a cross-sectional view of the semiconductor structure of FIG. 7 at a later stage of manufacture.

FIG. 8 shows the semiconductor structure of FIG. 7 at a later stage of manufacture. FIG. 8 shows a magnified view of one finger 155 (FIG. 1) of the trench capacitor 150 (FIG. 1) at the stage of manufacture of the semiconductor structure 100 shown in FIG. 8. After oxidation to form dielectric material 104 (FIGS. 5 and 6), the trench capacitor electrodes and dielectric may be formed. Prior to formation of the trench capacitor electrodes and dielectric, dielectric layers 510 (FIG. 7) and 512 (FIG. 7) may be optionally removed. In the example shown in FIG. 8 dielectric layers 510 (FIG. 7) and 512 (FIG. 7) have been removed. Dielectric layers 510 (FIG. 7) and 512 (FIG. 7) may be removed by for example a wet chemical etch, or a dry etch process such as, for example reactive ion etching (RIE). In some embodiments, two etching operations may be used to remove dielectric layers 514 (FIG. 7) and 516 (FIG. 7). In some embodiments, silicon nitride layer 512 (FIG. 7) may be etched using a wet chemical etch or a dry etch process such as, for example, a reactive ion etch (RIE). Silicon dioxide layer 510 (FIG. 7) may be etched using a wet chemical etch or a dry etch process such as, for example, a reactive ion etch (RIE).

After optional removal of dielectric layers 510 (FIG. 7) and 512 (FIG. 7), a conductive layer 750 may be formed over dielectric structure 104 and portions of substrate 110. Conductive layer 750 may be formed using deposition processes such as evaporation, sputtering, chemical vapor deposition (CVD), plating or electroplating. In one example conductive layer 750 may be formed using a conformal deposition process such that the thickness of conductive layer 750 is the same, or substantially the same on the horizontal surfaces of substrate 110 and dielectric material 104 and on the interior surfaces of cavities 712 (FIG. 7).

In one example conductive layer 750 may comprise conformal doped polysilicon. Doped polysilicon may be formed using low pressure chemical vapor deposition (LPCVD). The polysilicon may be doped during deposition or afterwards to increase its conductivity. Examples of dopants may include arsenic, phosphorous, antimony or boron. In one example conductive layer 750 may have a thickness in the range of about 0.1 µm to about 0.5 µm. While conductive layer 750 is shown as comprised of one layer, this is not a limitation of the claimed subject matter and conductive layer 750 may be comprised of more than one layer.

In another example (not shown), all or a portion of conductive layer 750 may be optionally converted to a conductive silicide to further reduce the resistance of the bottom electrode. After deposition of conductive layer 750 an optional metal layer may be deposited and annealed to form a conductive silicide. The optional metal layer may be may be formed using deposition processes such as evaporation, sputtering, chemical vapor deposition (CVD), plating or electroplating. In one example the optional metal may comprise tungsten and may have a thickness in the range of about 0.01 µm to about 0.1 µm. After the optional metal is deposited, it may be annealed to form a conductive silicide. In one example annealing may be performed in a temperature range of about 350° C. to about 650° C. The annealing ambient may comprise, for example, nitrogen, argon, hydrogen or combinations thereof.

After formation of conductive layer 750, dielectric layer 755 may be formed over conductive layer 750. Dielectric layer 755 may be formed using deposition processes such as evaporation, sputtering, or chemical vapor deposition (CVD) or may be formed using thermal oxidation. In one example dielectric layer 755 may be formed using a conformal deposition process such that the thickness of dielectric layer 755 is the same, or substantially the same on the horizontal surfaces of dielectric layer 750 and on the surface of conductive layer 750 lining the interior of cavities 712 (FIG. 7).

Dielectric layer 755 may comprise, for example silicon nitride or silicon dioxide. In one example dielectric layer 755 may comprise silicon nitride ($Si_3N_4$) and have a thickness ranging from about 50 Å to about 750 Å. Silicon nitride layer 755 may be formed using deposition techniques such as, for example, low pressure chemical vapor deposition (LPVCD).

In another example dielectric layer 755 may be formed by thermal oxidation. In one example in which conductive layer 750 comprises polysilicon and is not silicided, dielectric layer 755 may be formed by thermal oxidation of polysilicon layer 750. Polysilicon layer 750 may be oxidized, for example by heating in an ambient comprising oxygen and/or water vapor to a temperature in the range of about 650° C. to about 1050° C. In one example the thermal oxide layer may have a thickness ranging from about 50 Å to about 1000 Å.

While dielectric layer 755 is shown as comprised of one layer, this is not a limitation of the claimed subject matter and dielectric layer 755 may be comprised of more than one layer. In one example dielectric layer 755 may comprise three layers, for example an oxide/nitride/oxide (ONO) stack. In one example an ONO stack may be formed by low pressure chemical vapor deposition (LPCVD) of oxide, followed by LPCVD of silicon nitride, followed by LPCVD of oxide. In one example the oxide layers may have a thickness in the range of 50 Å to about 300 Å and the nitride layer may have a thickness in the range of 50 Å to about 300 Å. In other embodiments, dielectric layer 755 can be a high dielectric constant material such as Hafnium Oxide, which may be also be referred to as a high k dielectric material.

After formation of dielectric layer 755, conductive layer 760 may be formed over dielectric layer 755. Conductive layer 760 may be formed using deposition processes such as evaporation, sputtering, chemical vapor deposition (CVD), plating or electroplating.

In one example conductive layer 760 may comprise conformal doped polysilicon. Doped polysilicon may be formed using low pressure chemical vapor deposition (LPCVD). The polysilicon may be doped during deposition or afterwards to increase its conductivity. Examples of dopants may include arsenic, phosphorous, antimony or boron. The doped polysilicon may be deposited to a thickness sufficient to completely fill any remaining void space within cavities 712 (FIG. 7) and form a continuous layer of conductive material 760 over dielectric layer 755 and having a top surface that is parallel or substantially parallel to the surface 105 of substrate 110. In one example, conductive layer 760 may have a thickness, in the range of about 500 Å to about 2 µm. While conductive layer 760 is shown as comprised of one layer, this is not a limitation of the claimed subject matter and conductive layer 760 may be comprised of more than one layer.

Figure 9:
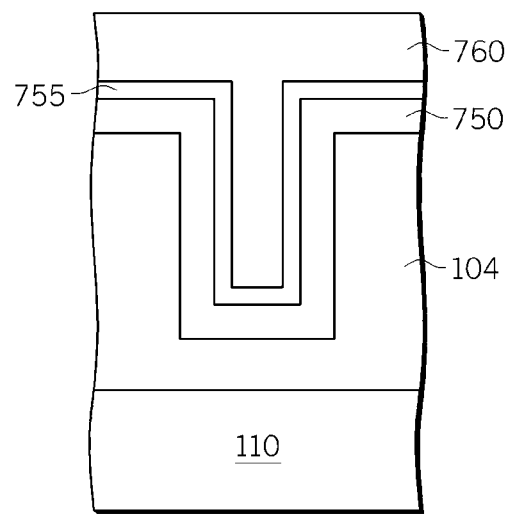
FIG. 9 is a magnified cross-sectional view of a portion of the semiconductor structure of FIG. 8.

Turning now to FIG. 9, which shows a magnified view of one finger 155 (FIG. 1) of the trench capacitor 150 (FIG. 1) at the stage of manufacture of the semiconductor structure 100 shown in FIG. 8. FIG. 9 shows one example in which conductive layer 750 and dielectric layer 755 may be deposited in a conformal manner such that the thickness of the material on the horizontal surfaces is the same, or substantially the same as the thickness on the vertical surfaces. In this example conductive layer 760 may be deposited in a conformal manner and is deposited to a thickness to completely fill any remaining void space within cavities 712 (FIG. 7) and form a continuous layer of conductive material 760 over dielectric layer 755 that has a top surface that is parallel or substantially parallel to the surface 105 of substrate 110. In other embodiments, conductive material 760 may be used to partially fill the remaining void space within cavities 712 (FIG. 7), and then another dielectric material (not shown) such as, for example, an oxide formed using tetraethylorthosilicate (TEOS) by LPCVD, may be formed over conductive material 760 to fill the remaining void space in cavities 717 (FIG. 7).

In the example shown in FIGS. 7 and 8, conductive layer 760 may be deposited to a thickness to completely fill any remaining void space within cavities 712 (FIG. 7) and form a continuous layer of conductive material 760 over dielectric layer 755 that has a top surface that is parallel or substantially parallel to the surface 105 of substrate 110. However, this is not a limitation of the claimed subject matter and conductive layer 760 may be deposited in such a way as to form a continuous coating over dielectric layer 755 but to not completely fill all of the remaining space in cavities 712 (FIG. 7).

Figure 10:
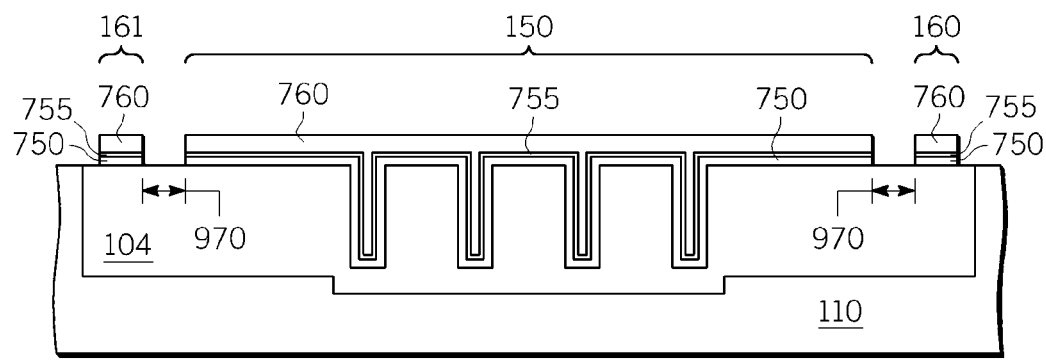
FIG. 10 is a cross-sectional view of the semiconductor structure of FIG. 8 at a later stage of manufacture.

FIG. 10 shows semiconductor structure 100 of FIG. 8 at a later stage of manufacture. After formation of conductive layer 760, conductive layer 760, dielectric layer 755 and conductive layer 750 may be patterned using photolithography and etching processes to form passive element regions 160 and 161 and trench capacitor 150. In one example a portion of conductive layer 760, a portion of dielectric layer 755 and a portion of conductive layer 750 may be removed using at least one etching operation. In some embodiments, two or more etching operations may be used. For example a portion of conductive layer 760, a portion of dielectric layer 755 and a portion of conductive layer 750 may be etched using a wet chemical etch or a dry etch process such as, for example, a reactive ion etch (RIE).

The spacing 970 between trench capacitor 150 and dielectric region 160 or 161 may in one example be in the range of about 1 μm to about 100 μm. In another example spacing 970 may be in the range of about 3 μm to about 15 μm.

Figure 11:
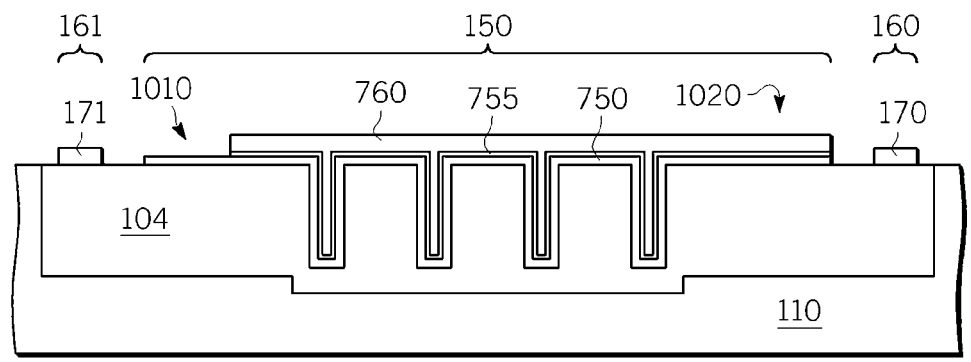
FIG. 11 is a cross-sectional view of the semiconductor structure of FIG. 10 at a later stage of manufacture.

FIG. 11 shows semiconductor structure 100 of FIG. 10 at a later stage of manufacture. After etching a portion of conductive layer 760, a portion of dielectric layer 755 and a portion of conductive layer 750 to form passive element regions 160 and 161 and trench capacitor 150, conductive layer 760 and dielectric layer 755 may be patterned using photolithography and etching processes to form passive elements 170 and 171 and to expose a portion of conductive layer 750 to form a bottom electrode contact 1010 of trench capacitor 150. In one embodiment a portion of conductive layer 760 and a portion of dielectric layer 755 may be removed using at least one etching operation. In other embodiments, two or more etching operations may be used. For example a portion of conductive layer 760 and a portion of dielectric layer 755 may be etched using a wet chemical etch or a dry etch process such as, for example, a reactive ion etch (RIE).

Bottom electrode contact 1010 of trench capacitor 150 may be formed from a portion of conductive layer 750 by removal of a portion of conductive layer 760 and a portion of dielectric layer 755 over bottom electrode contact 1010. Top electrode contact 1020 of trench capacitor 150 may be formed from a portion of conductive layer 760. Passive elements 170 and 171 may be formed from a portion of conductive layer 750 by removal of a portion of conductive layer 760 and a portion of dielectric layer 755 over conductive layer 750.

In the example shown in FIG. 11, passive elements 170 and 171 are formed from a portion of conductive layer 750. However, this is not a limitation of the claimed subject matter and in some embodiments passive elements 170 and 171 may be formed using separate deposition and etching processes such that the material used to form passive elements 170 and 171 is different from conductive material 750.

Figure 12:
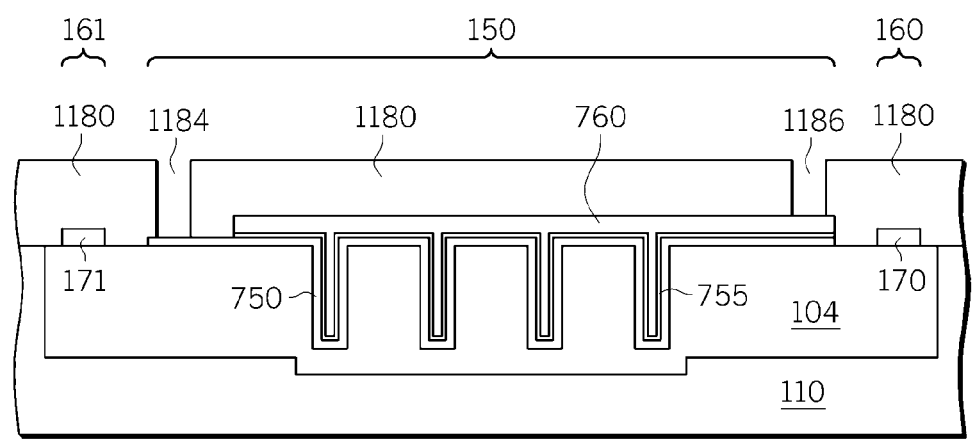
FIG. 12 is a cross-sectional view of the semiconductor structure of FIG. 11 at a later stage of manufacture.

FIG. 12 shows semiconductor structure 100 of FIG. 11 at a later stage of manufacture. After formation of passive elements 170 and 171 and bottom electrode contact 1010, dielectric layer 1180 may be formed and patterned to form opening 1184 to expose bottom electrode contact 1010 and to form opening 1186 to expose top electrode contact 1020. Dielectric layer 1180 may comprise dielectric materials such as silicon dioxide, silicon nitride, phosphorus silicate glass (PSG), boron phosphorus silicate glass (BPSG), an oxide formed using tetraethylorthosilicate (TEOS), or the like. An oxide formed using TEOS may be referred to as a using a TEOS oxide. In one example dielectric layer 1180 may comprise silicon dioxide formed by plasma enhanced CVD (PECVD) deposition. In one example the thickness of dielectric layer 1180 may range from about 3000 Å to about 3 μm. While dielectric layer 1180 as a single layer, this is not a limitation of the claimed subject matter and dielectric layer 1180 may be comprised of more than one layer. Although not shown, in other embodiments where trench capacitor 150 is integrated with other devices (not shown) such as, for example, field effect transistors (FETs), dielectric layer 1180 can be an interlayer dielectric (ILD). Accordingly, in these embodiments, the cost and/or complexity of fabricating an integrated circuit (IC) may be reduced by forming elements of trench capacitor 150 simultaneously with other elements of the integrated circuit using the same processes and materials to form multiple elements of the integrated circuit.

After formation of dielectric layer 1180, dielectric layer 1180 may be patterned using photolithography and etching processes to form opening 1184 to expose bottom electrode contact 1010 and to form opening 1186 to expose top electrode contact 1020. Openings 1184 and 1186 may be formed using at least one etching operation. In some embodiments, two or more etching operations may be used to form openings 1184 and 1186. Dielectric layer 1180 may be etched using a wet chemical etch or a dry etch process such as, for example, a reactive ion etch (RIE).

Turning back to FIG. 1, FIG. 1 shows the semiconductor structure of FIG. 12 at a later stage of manufacture. After formation of opening 1184 to expose bottom electrode contact 1010 and to form opening 1186 to expose top electrode contact 1020, contacts 300 and 301 may be formed using deposition processes such as evaporation, sputtering, or chemical vapor deposition (CVD). Contacts 300 and 301 may also be formed using plating or electroplating. In one example contacts 300 and 301 may comprise AlSiCu where the percentage of Si may range from about 0.4% to about 1.5% and the percentage of Cu may range from about 0.4% to about 1.5%. In another example contacts 300 and 301 may comprise more than one material deposited sequentially; for example contacts 300 and 301 may comprise three layers of titanium/titanium nitride/aluminum+silicon+copper (Ti/TiN/AlSiCu). The Ti layer may act as an adhesion layer and may be in the range of about 10 Å to about 500 Å thick. The TiN layer may act as a barrier layer and may be in the range of about 200 Å to about 1000 Å thick. The Al/Si/Cu layer may be in the range of about 0.25 micron to about 4 microns thick. The materials and dimensions given here are for one or more embodiments and are not a limitation of the claimed subject matter. Other materials, for example aluminum+silicon (AlSi), titanium+tungsten (TiW) and titanium+tungsten+copper (TiWCu), as well as other dimensions may be used.

After deposition of the contact metal it may be patterned using photolithography and etching processes to form contacts 300 and 301. Contacts 300 and 301 may be formed using at least one etching operation. In some embodiments, two or more etching operations may be used to form contacts 300 and 301. For example contacts 300 and 301 may be etched using a wet chemical etch or a dry etch process such as, for example, a reactive ion etch (RIE).

In this example contacts 300 and 301 are formed after formation of conductive layer 760. However, this is not a limitation of the claimed subject matter and contacts 300 and 301 may be formed at a later stage in the process, for example after fabrication of a portion of or substantially all of or all of the active device processing.

In this example, contacts 300 and 301 are formed simultaneously. However, this is not a limitation of the claimed subject matter and contacts 300 and 301 may be formed at separate times, and may comprise different materials.

Accordingly, an integrated passive device such as, for example, capacitor 150 may be formed in a dielectric structure such as, for example, dielectric structure 104. A portion of, all of, substantially all of, or a majority of dielectric structure 104 is below the top surface 105 of substrate 110. In addition, in some embodiments, a majority of capacitor 150 can be embedded in dielectric structure 104 below surface 105 of a substrate 110 and at least a portion of capacitor 150 is above surface 105 and over dielectric structure 104.

In some embodiments, when the semiconductor structure shown in FIG. 3 is oxidized, the 2.2× volume expansion that occurs when silicon is oxidized may cause strain in the oxide as well as in adjacent semiconductor regions. This strain may cause warping or buckling of the long walls of cavities 616 (FIG. 3). Furthermore the strain may also cause dislocations or other defects which may degrade the performance of active devices situated in the vicinity of trench capacitor 150. In another embodiment, stress relief features may be incorporated to decrease the level of strain in trench capacitor 150 (FIG. 1) and surrounding structures.

Figure 13:
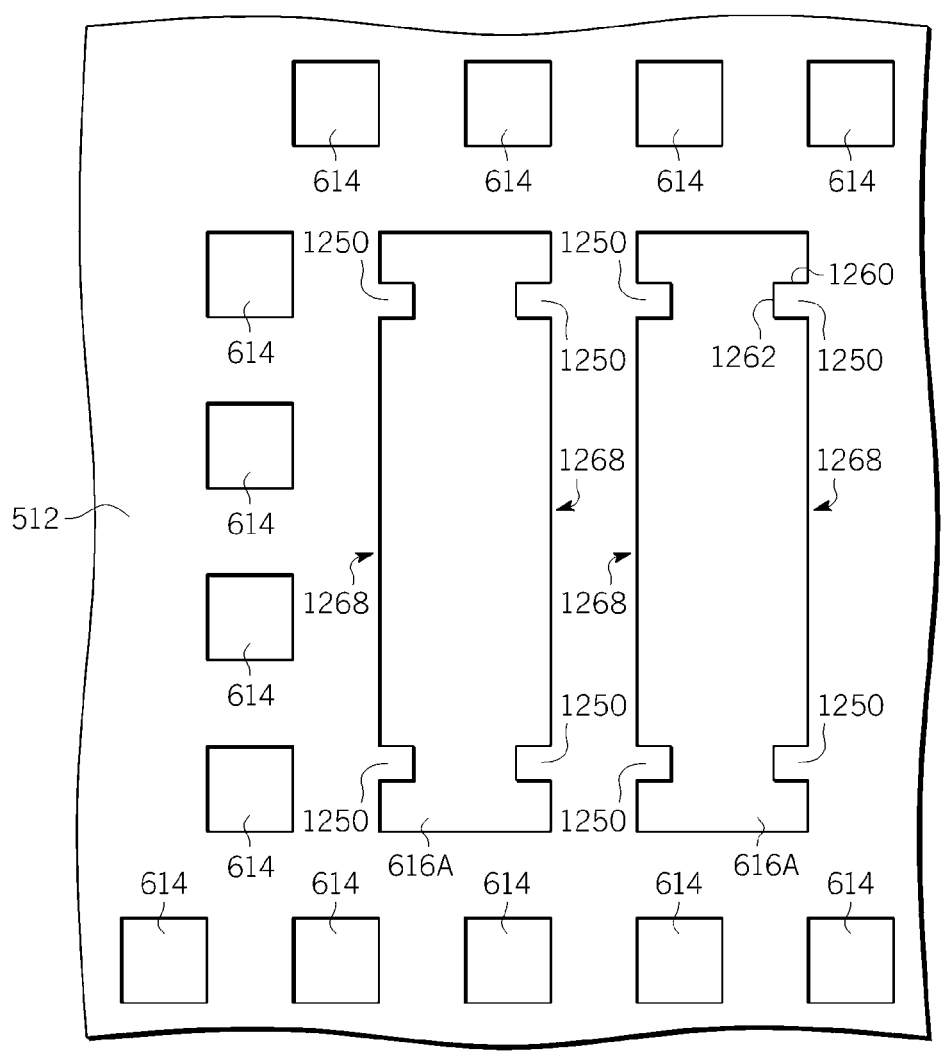
FIG. 13 is a plan view of another semiconductor structure in accordance with an embodiment.

Referring now to FIG. 13, FIG. 13 shows a portion of a semiconductor structure 200 similar to that of semiconductor structure 100 of FIG. 6. Semiconductor structure 200 is similar to semiconductor structure 100 but with the addition of a stress relief features 1250. Cavities 616A are similar to cavities 616 shown in FIG. 6, but with the addition of stress relief features 1250. Stress relief features 1250 may provide compliance to the long side 1268 of cavities 616A, and thus may reduce the overall strain after oxidation When the structure shown in FIG. 13 is oxidized, stress relief features 1250 may compress and thus may reduce or prevent buckling of the long sides 1268 of cavities 616A after oxidation. Stress relief features 1250 may also translate a component of the stress that is induced during oxidation to a direction that is not parallel to the long side 1268 of cavities 616A, resulting in a relative reduction in the stress along the direction parallel to the long side 1268 of cavities 616A.

In one example, stress relief features 1250 may be incorporated at the ends of cavities 616A as shown in FIG. 13. In this example stress relief features may have a square or rectangular shape. In one example the length of a side 1260 of stress relief feature 1250 may be in the range of about 10% to about 40% of the width of cavity 616A and the length of a side 1262 of stress relief feature 1250 may be in the range of about 0.5% to about 1% of the length of cavity 616A. While stress relief features 1250 shown in FIG. 13 are rectangular, this is not a limitation of the claimed subject matter. In other embodiments, stress relief features 1250 may have any shape, for example a diamond or circular shape. Since the only difference between semiconductor structure 100 (FIG. 1) and semiconductor structure 200 (FIG. 13) is the shape of cavity 616A, in one embodiment, semiconductor structure 200 shown in FIG. 13 may be fabricated using the same process as, or processes similar to the process, described above and shown in FIGS. 2 to 11.

Figure 14:
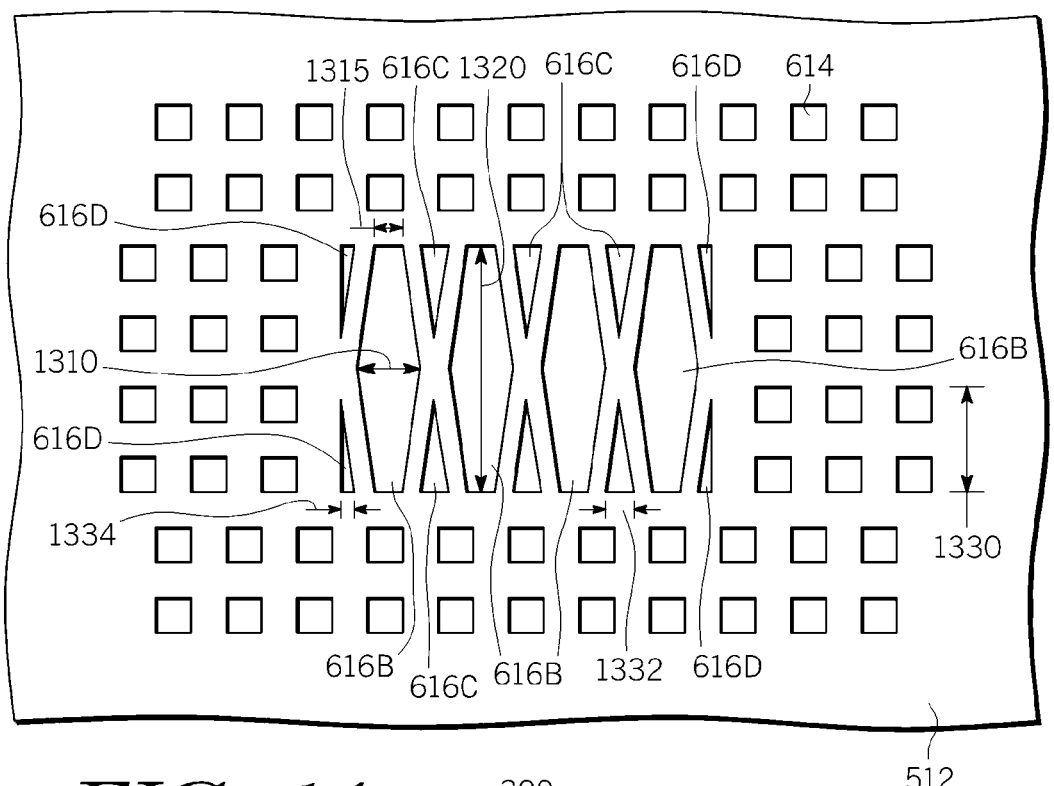
FIG. 14 is a plan view of another semiconductor structure in accordance with an embodiment.

In the embodiment shown in FIG. 13, stress relief features 1250 have been added to cavity 616A. In another embodiment the shape of cavity 616 FIG. 6 may be modified to generate relatively less stress after oxidation than the rectangular cavity shape of cavity 616 shown in FIG. 6. FIG. 14 shows an embodiment that incorporates a modified cavity shape that may provide relatively less stress after oxidation than is present using the rectangular cavity shape of cavity 616 shown in FIG. 6.

Referring now to FIG. 14, FIG. 14 shows a semiconductor structure 300 similar to that of semiconductor structure 100 from FIG. 6. Semiconductor structure 300 is similar to semiconductor structure 100 but the shape of cavities 616 FIG. 6 has been modified. Cavities 616B are similar to cavities 616 shown in FIG. 6 except that the long wall has been changed from straight to angled, resulting in a hexagonally shaped cavity. The angled walls of cavities 616B may provide compliance to the long dimension of cavities 616B, and thus may reduce the overall strain in the cavity after oxidation. When the structure shown in FIG. 14 is oxidized, the angled walls of cavities 616B may translate a component of the stress that is induced during oxidation to a direction that is not parallel to the long dimension of cavities 616B, resulting in a relative reduction in the stress along the direction parallel to the long dimension of cavities 616B.

In addition to cavities 616B, semiconductor structure 300 may also comprise optional cavities 616C and/or 616D. If optional cavities 616C and/or 616D are not included, after oxidation some silicon may remain adjacent to the angled walls of cavities 616B. Inclusion of optional cavities 616C and/or 616D may reduce or eliminate the presence of any residual silicon adjacent to cavities 712A (FIG. 15) after oxidation.

Figure 15:
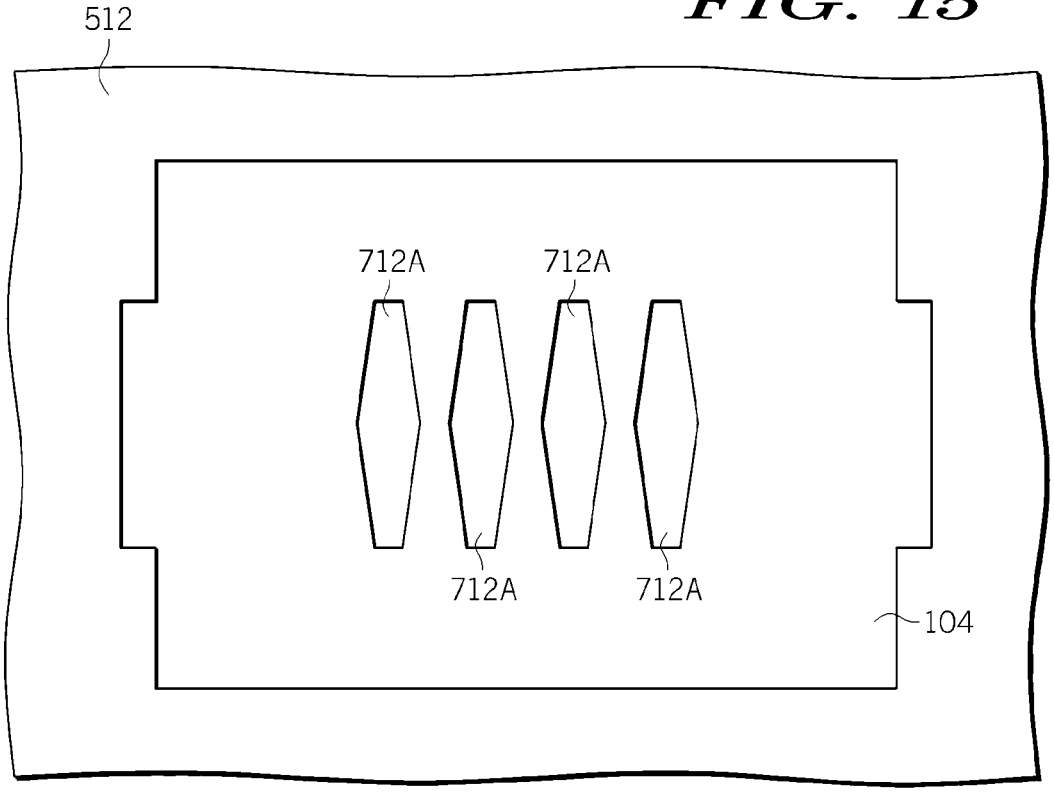
FIG. 15 is a plan view of the semiconductor structure of FIG. 14 at a later stage of manufacture.

FIG. 15 shows semiconductor structure 300 of FIG. 14 after oxidation. Optional cavities 616C (FIG. 14) and cavities 616D (FIG. 14) have been included in this example. Referring to FIG. 15, cavities 614 (FIG. 14), cavities 616C (FIG. 14) and cavities 616D (FIG. 14) have been eliminated by the 2.2× volume expansion of silicon upon oxidation. Cavities 712A are formed by oxidation of the interior surfaces of cavities 616B (FIG. 14). Since the only difference between semiconductor structure 100 (FIG. 1) and semiconductor structure 300 (FIG. 14) is the shape of cavity 616B and the possible inclusion of optional cavities 616C and 616D, in one embodiment, semiconductor structure 300 shown in FIG. 14 may be fabricated using the same process as, or processes similar to the process, described above and shown in FIGS. 2 to 11.

Referring back to FIG. 14, in some examples cavity 616B may have a hexagonal shape. Cavities 616B have a long dimension 1320 and a short dimension 1310. The length of the short side of cavities 616B is referenced as 1315. In some examples the ratio of long dimension 1320 to short dimension 1310 may be in the range of about 5 to 2000. In one example short dimension 1310 may be in the range of about 0.5 μm to about 5 μm. In one example long dimension 1320 may be in the range of about 10 μm to about 1500 μm. In one example short side 1315 may be in the range of about 0.2 μm to about 4 μm.

While cavities 616B are shown as all having the same dimensions in the example in FIG. 14, this is not a limitation of the claimed subject matter and cavities 616B may have different dimensions. Furthermore, although cavities 616B are shown as hexagonal, this is not a limitation of the claimed subject matter and cavities 616B may have other shapes that may provide stress relief and may be formed in a periodic or non-periodic arrangement.

Optional cavities 616C and 616D have a long dimension 1330. Optional cavities 616C have a short dimension 1332 and optional cavities 616D have a short dimension 1334. In one example long dimension 1330 may be in the range of about 5 µm to about 750 µm. In one example short dimension 1332 of cavities 616C may be about two times short dimension 1334 of cavities 616D. In one example short dimension 1332 may be in the range of about 0.2 µm to about 5 µm and short dimension 1334 may be in the range of about 0.1 µm to about 3 µm.

Figure 16:
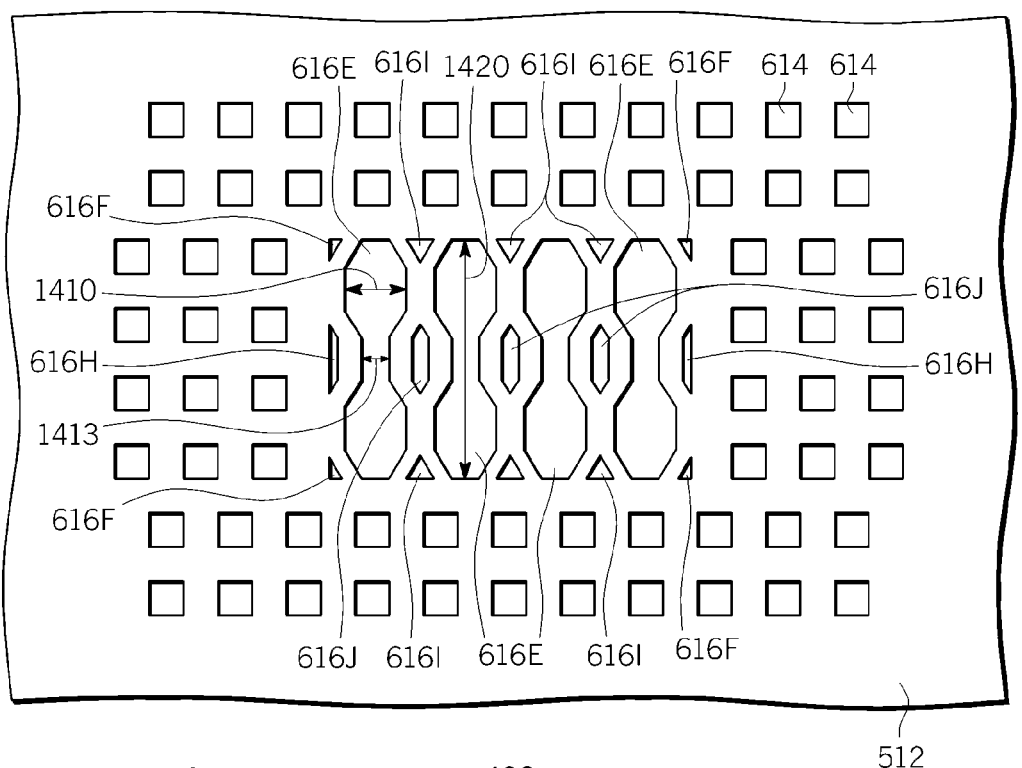
FIG. 16 is a plan view of another semiconductor structure; in accordance with an embodiment.

In another embodiment, stress relief features may also be incorporated into the cavity walls. In one example shown in FIG. 16, nonlinear features such as, for example, s-shaped, wavy or spring-like features have been incorporated into cavity 616E. In other words, sidewalls of cavity 616E can be nonlinear. For example, s-shaped, wavy or spring-like features may be incorporated into the long sidewalls of cavity 616E. FIG. 16 shows an embodiment that incorporates s-shaped, wavy or spring-like features that may provide relatively less stress after oxidation than is present using the rectangular cavity shape of cavity 616 shown in FIG. 3.

Referring now to FIG. 16, FIG. 16 shows semiconductor structure 400 which similar to that of semiconductor structure 100 from FIG. 6. Semiconductor structure 400 is similar to semiconductor structure 100 except that the shape of cavities 616 FIG. 6 has been modified. Cavities 616E are similar to cavities 616 shown in FIG. 6, but s-shaped, wavy or spring-like features have been incorporated into the long walls of cavities 616E. The s-shaped, wavy or spring-like features of cavities 616E may provide compliance to the long dimension of cavities 616E, and thus may reduce the overall strain in the cavity after oxidation. When the structure shown in FIG. 16 is oxidized, the s-shaped, wavy or spring-like features of cavities 616E may translate a component of the stress that is induced during oxidation to a direction that is not parallel to the long dimension of cavities 616E, resulting in a relative reduction in the stress along the direction parallel to the long dimension of cavities 616E.

In addition to cavities 616E, semiconductor structure 400 may also comprise optional cavities 616F, 616H, 616*I* and/or 616J. If optional cavities 616F, 616H, 616*I* and/or 616J are not included, after oxidation some silicon may remain adjacent to the angled walls of cavities 616E. Inclusion of optional cavities 616F, 616H, 616*I* and/or 616J may reduce or eliminate the presence of any residual silicon after oxidation.

Since the only difference between semiconductor structure 100 (FIG. 1) and semiconductor structure 400 (FIG. 16) is the shape of cavity 616E and the possible inclusion of optional cavities 616F, 616H, 616*I* and/or 616J, in one embodiment, semiconductor structure 400 shown in FIG. 16 may be fabricated using the same process as, or processes similar to the process, described above and shown in FIGS. 2-11.

Cavities 616E have a long dimension 1420, a maximum width of the short dimension 1410 and a minimum width of the short dimension 1413. In some examples the ratio of long dimension 1420 to maximum width of short dimension 1410 may be in the range of about 5 to 2000. In one example minimum width of short dimension 1413 may be large enough that cavity 616E is not pinched off after oxidation. In one example minimum width of short dimension 1413 may be at least 1.1 times the width of cavity 614 to prevent pinching off of cavity 616E after oxidation. In one example maximum width of short dimension 1410 may be in the range of about 1 µm to about 5 µm. In one example long dimension 1420 may be in the range of about 20 µm to about 1500 µm. In one example minimum width of short dimension 1413 may be in the range of about 0.5 µm to about 3 µm.

While cavities 616E are shown as all having the same dimensions in the example in FIG. 16, this is not a limitation of the claimed subject matter and cavities 616E may have different dimensions. Furthermore, although cavities 616E are shown with s-shaped, wavy or spring-like sidewall features, this is not a limitation of the claimed subject matter and cavities 616E may have other shapes incorporated into the sidewalls that may provide stress relief and may be formed in a periodic or non-periodic arrangement.

The specific size and quantity of optional cavities 616F, 616H, 616*I* and/or 616J is dependent on the specific shape of cavity 616E. The basic design rule is to adjust the quantity, placement and size of optional cavities 616F, 616H, 616*I* and/or 616J to minimize or eliminate any silicon embedded in dielectric structure 104 after oxidation. While the example in FIG. 16 shows a certain size, placement and quantity of optional cavities, this is not a limitation of the claimed subject matter and in other embodiments none, or any number of different size, shape or quantity optional cavities may be utilized.

Figure 17:
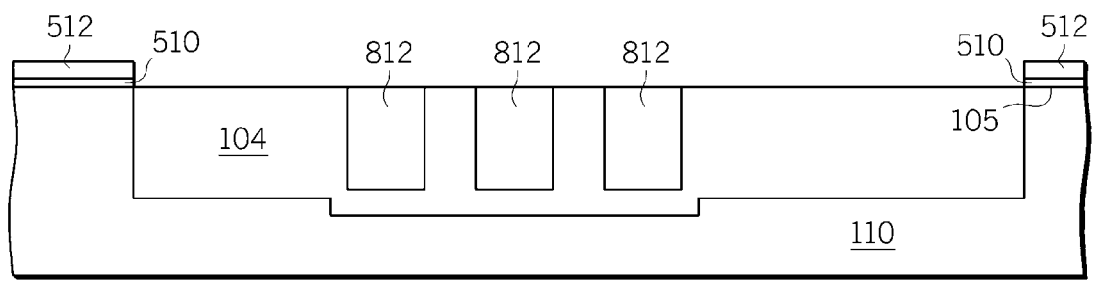
FIG. 17 is a cross-sectional view of another semiconductor structure, based on the semiconductor structure of FIG. 7 in accordance with an embodiment.

In another embodiment, the formation of trench capacitor 150 may be delayed after formation of dielectric structure 104 to permit fabrication of other active and/or passive devices prior to formation of trench capacitor 150. FIG. 17 shows the semiconductor structure of FIG. 7 at a later stage of manufacture, in which processing of the trench capacitor may be delayed until further in the fabrication process. The semiconductor structure in FIG. 17 is referenced as 500.

After formation of cavities 712 (FIG. 7), cavities 712 (FIG. 7) may be filled with a sacrificial material 812. In one example sacrificial material 812 may comprise polysilicon and may be formed using low pressure chemical vapor deposition (LPCVD). After formation of sacrificial material 812, excess sacrificial material 812 may be removed, leaving sacrificial material 812 only in cavities 712 (FIG. 7) with a surface coplanar or substantially coplanar with surface 105. Excess sacrificial material 812 may be removed using wet chemical etching, dry (RIE) etching, chemical mechanical polishing (CMP) or a combination of these processes. Other suitable materials for sacrificial material 812 may include silicon nitride, phosphorus silicate glass (PSG), boron phosphorus silicate glass (BPSG), an oxide formed using tetraethylorthosilicon (TEOS), or the like.

Figure 18:
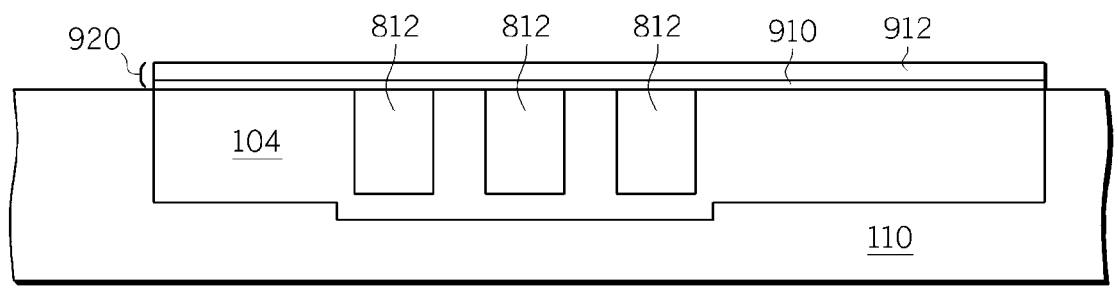
FIG. 18 is a cross-sectional view of the semiconductor structure of FIG. 17 at a later stage of manufacture.

Turning now to FIG. 18, FIG. 18 shows semiconductor structure 500 of FIG. 17 at a later stage of manufacture. At this stage of the process, dielectric layers 510 and 512 may be optionally removed. Referring to the example shown in FIG. 18, dielectric layers 510 and 512 have been removed. Dielectric layers 510 and 512 may be removed as part of the process of removing excess sacrificial material 812 or in one or more separate steps.

After optional removal of dielectric layers 510 and 512, protection structure 920 may be formed over sacrificial material 812 and dielectric structure 104 for protection during subsequent processing. Protection structure 920 may comprise one or more layers. In the embodiment shown in FIG. 18 protection structure 920 is comprised of layers 910 and 912.

At the stage illustrated in FIG. 18, dielectric layer 910 may be formed over sacrificial material 812 and dielectric structure 104 and dielectric layer 912 may be formed over dielectric layer 910. In one example dielectric layer 910 may be silicon dioxide and dielectric layer 912 may be silicon nitride. Dielectric layer 910 may comprise, for example, silicon dioxide and have a thickness ranging from about 50 Å to about 5,000 Å. Dielectric layer 910 may be formed using deposition techniques, such as for example low pressure chemical vapor deposition (LPVCD) or sputtering. Dielectric layer 912 may comprise, for example, silicon nitride ($Si_3N_4$) and have a thickness ranging from about 100 Å to about 15,000 Å. Dielectric layer 912 may be formed using deposition techniques, for example, low pressure chemical vapor deposition (LPVCD) of silicon nitride.

After formation of protection structure 920, active devices may be formed in portions of substrate 110 using conventional techniques. Similarly passive components may be formed on or over portions of dielectric structure 104 or in or over portions of substrate 110 using conventional techniques.

Figure 19:
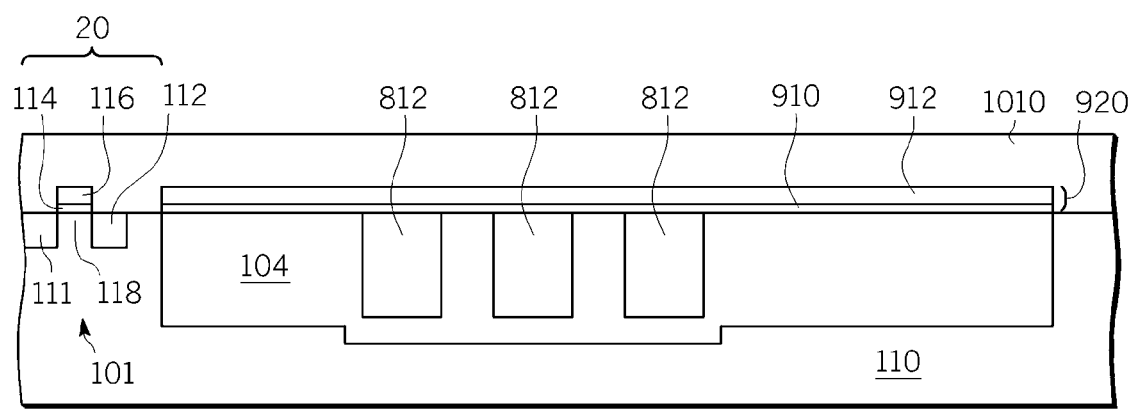
FIG. 19 is a cross-sectional view of the semiconductor structure of FIG. 18 at a later stage of manufacture.

FIG. 19 shows semiconductor structure 500 of FIG. 18 at a later stage of manufacture. As seen in FIG. 19 a field effect transistor (FET) 101 may be formed in an active region 20 of semiconductor structure 500. FET 101 may be a metal-on-semiconductor field effect transistor (MOSFET) and may include a source region 111 in a portion of substrate 110, a drain region 112 in a portion of substrate 110, a gate oxide 114 over a portion of substrate 110, a gate 116 over gate oxide 114, and a channel region 118 formed in a portion of substrate 110 under gate oxide 114 and between doped regions 111 and 112.

After formation of active and/or passive components, an active device protection layer 1010 may be formed over active region 20, portions of substrate 110 and protection structure 920. Active protection layer 1010 may comprise dielectric materials such as silicon dioxide, silicon nitride, phosphorus silicate glass (PSG), boron phosphorus silicate glass (BPSG), an oxide formed using tetraethylorthosilicon (TEOS), or the like. In one example active device protection layer 1010 may comprise silicon dioxide formed by PECVD. In one example the thickness of active device protection layer 1010 may range from about 2000 Å to about 5 μm. While active device protection layer 1010 shown in FIG. 19 is comprised of one layer, this is not a limitation of the claimed subject matter and active device protection layer 1010 may be comprised of more than one layer.

Figure 20:
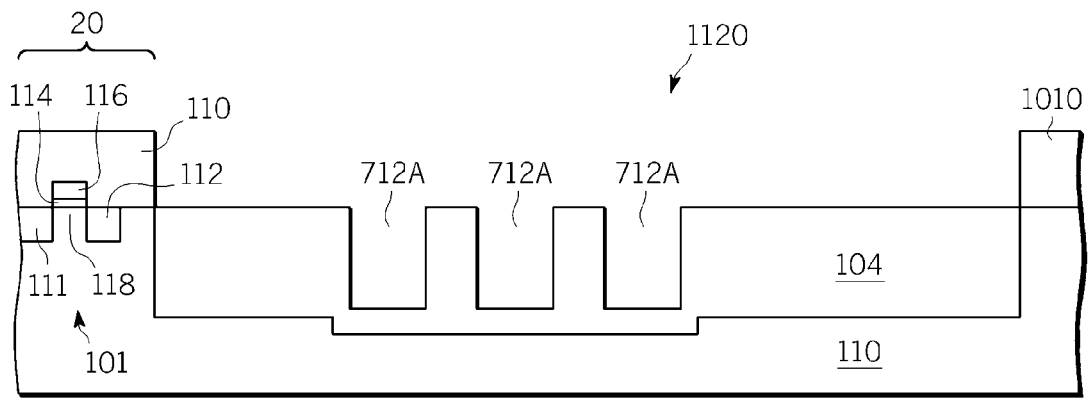
FIG. 20 is a cross-sectional view of the semiconductor structure of FIG. 19 at a later stage of manufacture.

FIG. 20 shows semiconductor structure 500 of FIG. 19 at a later stage of manufacture. After formation of active protection layer 1010, active protection layer 1010, dielectric layer 912 and dielectric layer 910 may be patterned using photolithography and etching processes to form opening 1120 to expose sacrificial material 812 (FIG. 19) and dielectric structure 104. Opening 1120 may be formed using at least one etching operation. In some embodiments, two or more etching operations may be used to form opening 1120. In some embodiments, active protection layer 1010 may be etched using a wet chemical etch or a dry etch process such as, for example, a reactive ion etch (RIE). Silicon nitride layer 912 may be etched using a wet chemical etch or a dry etch process such as, for example, a reactive ion etch (RIE). Silicon dioxide layer 910 may be etched using a wet chemical etch or a dry etch process such as, for example, a reactive ion etch (RIE).

After formation of opening 1120, sacrificial material 812 (FIG. 19) may be removed. One etching step may be used to remove sacrificial material 812 (FIG. 11), although the methods and apparatuses described herein are not limited in this regard. In another embodiment, sacrificial material 812 (FIG. 11) may be removed in the same etching step as used for removal of a portion of dielectric layer 910 to form opening 1120. In one example sacrificial material 812 (FIG. 19) may be removed using a wet chemical or dry etch, for example reactive ion etching (RIE). Removal of sacrificial material 812 (FIG. 19) leaves cavities 712A which may be the same, or substantially the same as cavities 712 shown in FIG. 7.

Figure 21:
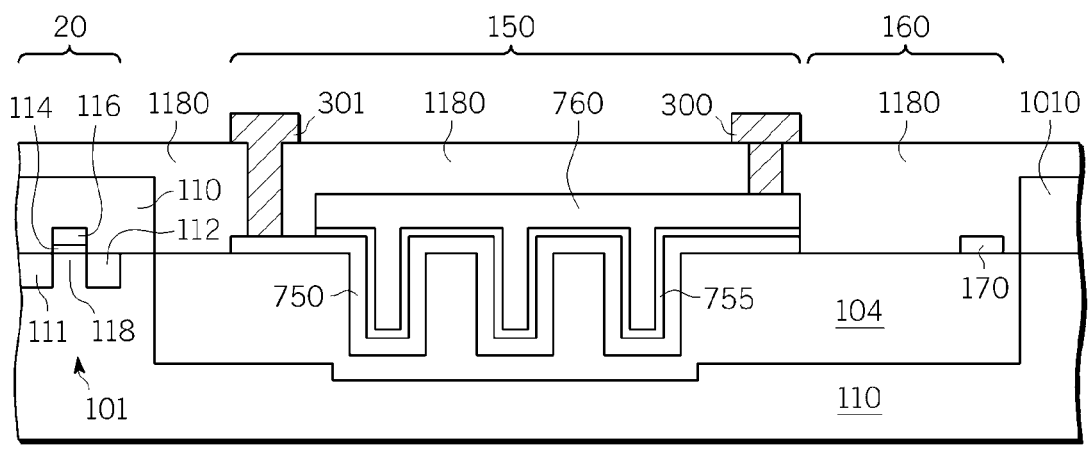
FIG. 21 is a cross-sectional view of the semiconductor structure of FIG. 20 at a later stage of manufacture.

After removal of sacrificial material 812 (FIG. 19) processing of trench capacitor 150 may proceed using the process described above in reference to FIGS. 7-11. FIG. 21 shows semiconductor structure 500 of FIG. 20 at a later stage of manufacture. As seen in FIG. 21, semiconductor structure 500 comprises active region 20, substrate 110, dielectric material 1180 dielectric material 1010 and dielectric structure 104. Dielectric structure 104 may be referred to as a dielectric platform, dielectric material or a dielectric region. Dielectric structure 104 may be comprised mainly of one or more low dielectric constant materials, for example silicon dioxide. In addition, in some embodiments, dielectric structure 104 may include one or more voids or air gaps.

In some embodiments, substrate 110 may be referred to as a device layer or an active layer. Further, in some embodiments, substrate 110 may include one or more epitaxial layers or bonded layers. Substrate 110 may comprise a semiconductor material such as, for example, silicon, and may be doped or undoped depending on the application.

Dielectric structure 104 may comprise passive element region 160 and trench capacitor 150. As shown in FIG. 1 passive element 170 may be formed over a portion of dielectric structure 104, for example in region 160 adjacent to trench capacitor 150, using conventional semiconductor processing. Examples of passive devices may include capacitors, inductors, and resistors or interconnects.

In another embodiment, only a portion of sacrificial material 812 (FIG. 19) may be removed prior to formation of trench capacitor 150. In this example spacing 645 (FIG. 7) between the bottom of trench capacitor 150 and conductive substrate 110 may be increased beyond that of the oxide thickness. In another example where sacrificial material 812 comprises polysilicon, the remaining polysilicon 812 may be oxidized to convert the polysilicon to oxide prior to formation of trench capacitor 150. In this example spacing 645 between the bottom of trench capacitor 150 and conductive substrate 110 (FIG. 7) may be increased and the material between trench capacitor 150 and conductive substrate 110 may comprise oxide instead of polysilicon.

Accordingly, various structures and methods have been disclosed to provide a relatively thick, embedded dielectric region that may be a dielectric support structure capable of supporting one or more high capacitance, embedded trench capacitors. In various embodiments, the disclosed semiconductor structure may provide for large value capacitors with reduced parasitic capacitances, relatively higher frequencies of operation, improved isolation, reduced cross-talk or combinations thereof between capacitors and other active and/or passive circuit elements. The disclosed semiconductor structure may also allow for the formation of passive devices having a relatively high quality factor (Q), and enable relatively higher frequency of operation of any devices formed using, or in conjunction with, a structure that includes the disclosed dielectric structure.

Although specific embodiments have been disclosed herein, it is not intended that the claimed subject matter be limited to the disclosed embodiments. Those skilled in the art will recognize that modifications and variations can be made without departing from the spirit of the claimed subject matter. It is intended that the claimed subject matter encompass all such modifications and variations as fall within the scope of the appended claims.

What is claimed is:

1. A semiconductor structure, comprising:
 a semiconductor material comprising a conductive substrate;

a first dielectric material below a surface of the semiconductor material;

one or more trenches in the first dielectric material, wherein the conductive substrate is disposed below the trenches of the capacitor and separated from the trenches of the capacitor by the dielectric material;

a capacitor formed in the one or more trenches, the capacitor including a first conductive material formed over the semiconductor material surface and lining the sidewalls and bottoms of the one or more trenches formed in the first dielectric material to provide a first plate of the capacitor, a second dielectric material formed over the first plate of the capacitor and a second conductive material formed within the second dielectric material to provide a second plate of the capacitor;

wherein the second conductive material comprises a substantially planar portion, the substantially planar portion being disposed over two or more of the trenches external to the trenches, and wherein the second conductive material comprises a plurality of extensions that extend from the substantially planar portion into the trenches, wherein in a given trench the extension is surrounded on opposite sides of the trench by first conductive material; and first and second electrical interconnects to the capacitor extending above a surface of the second dielectric material, the first electrical interconnect coupled to the first conductive material, and the second electrical interconnect coupled to the second conductive material.

2. The semiconductor structure of claim 1, wherein the first conductive material comprises a doped polysilicon and the second conductive material comprises a doped polysilicon.

3. The semiconductor structure of claim 1, wherein the second dielectric material comprises silicon nitride or oxide.

4. The semiconductor structure of claim 1, wherein the second dielectric material comprises a plurality of dielectric materials.

5. The semiconductor structure of claim 4, wherein the plurality of dielectric materials comprises a first layer of oxide over the first conductive layer, a second layer of silicon nitride over the first layer of oxide, and a third layer of oxide over the second layer of silicon nitride.

6. The semiconductor structure of claim 1, wherein the first conductive material comprises a conductive silicide.

7. The semiconductor structure of claim 1, wherein the second conductive material comprises a continuous conductive material.

8. The semiconductor structure of claim 1, further comprising a third conductive material electrically coupled to the second conductive material.

9. The semiconductor structure of claim 1, wherein the one or more trenches each extend at least about three microns or greater below the surface of the semiconductor material.

10. The semiconductor structure of claim 1, wherein a portion of the first dielectric material between the semiconductor material and the bottom of a first trench of the one or more trenches has a thickness of at least about 0.7 µm or greater.

11. The semiconductor structure of claim 1, further comprising an active circuit element, wherein a portion of the active circuit element is in the semiconductor material and wherein the first dielectric material surrounds or partially surrounds the portion of the active circuit element.

12. The semiconductor structure of claim 1, further comprising forming at least a portion of an electrically conductive material over at least a portion of the first dielectric material.

13. The semiconductor structure of claim 1, wherein a sidewall of a first trench of the one or more trenches comprises stress relief elements comprising s-shaped, wavy, hexagonal, octagonal, rectangular, triangular, or spring-like features, or combinations thereof.

14. A semiconductor structure, comprising:
a semiconductor material;
a first dielectric material below a surface of the semiconductor material;
one or more trenches in the first dielectric material;
a capacitor formed in the one or more trenches, the capacitor including a first conductive material formed over the semiconductor material surface and lining the sidewalls and bottoms of the one or more trenches formed in the first dielectric material to provide a first plate of the capacitor, a second dielectric material formed over the first plate of the capacitor and a second conductive material formed over the second dielectric material to provide a second plate of the capacitor;
wherein a sidewall of a first trench of the one or more trenches comprises stress relief elements comprising s-shaped, wavy, hexagonal, octagonal, rectangular, triangular, or spring-like features, or combinations thereof.

15. Wherein the stress relief elements are periodically disposed.

16. Wherein the stress relief elements are non-periodically disposed.

* * * * *